United States Patent [19]

Huber

[11] Patent Number: 5,247,680
[45] Date of Patent: Sep. 21, 1993

[54] APPARATUS FOR DIGITIZING THE SETTING OF A POTENTIOMETER

[75] Inventor: Wolfgang Huber, Vienna, Austria

[73] Assignee: U.S. Philips Corp., New York, N.Y.

[21] Appl. No.: 581,499

[22] Filed: Sep. 11, 1990

[30] Foreign Application Priority Data

Oct. 10, 1989 [AT] Austria .................. 2341/89

[51] Int. Cl.⁵ .................................................. G06F 9/44
[52] U.S. Cl. .................................. 395/800; 364/921.9;
364/260.8; 364/264.5; 364/264; 364/DIG. 1
[58] Field of Search ................ 395/575, 800; 371/71

[56] References Cited

U.S. PATENT DOCUMENTS

| | | | |
|---|---|---|---|
| 4,157,699 | 6/1979 | Mori | 123/417 |
| 4,574,226 | 3/1986 | Binder | 318/317 |
| 4,777,483 | 10/1988 | Fowler | 340/706 |
| 4,907,562 | 3/1990 | Johansson | 123/605 |

Primary Examiner—Robert B. Harrell
Assistant Examiner—Eric Coleman
Attorney, Agent, or Firm—Steven R. Biren

[57] ABSTRACT

A circuit including an adjusting control (e.g. a potentiometer) which has two end connections and a slider which is adjustable for setting different resistance ratios. The two end connections of the potentiometer are each connected to one of two connections of a microprocessor and the slider is connected to one connection of a capacitor. The other capacitor connection is connected to a predetermined potential. To each of the two microprocessor connections at least one controllable switch is connected for optionally connecting a first potential (V1) or a second potential (V2) to the relevant microprocessor connection. The microprocessor executes a program run in which the capacitor, which has previously been brought into an initial charge state, is recharged first via one resistance section (R1) and then via the other resistance section (R2) of the potentiometer. In each case a measurement value Z(Z2), Z(Z3) corresponding to a capacitor recharging period (TU1, TU2) is determined and from the determined measurement values Z(Z2), Z(Z3) a digital data word signal (SQ) is generated by forming the quotient thereof. This digital signal represents the resistance ratio set by the slider of the potentiometer.

15 Claims, 4 Drawing Sheets

APPARATUS FOR DIGITIZING THE SETTING OF A POTENTIOMETER

BACKGROUND OF THE INVENTION

This invention relates to a Circuit arrangement comprising an adjustment control which includes two end connections and a slider, which is adjustable between the two end connections, for setting different resistance ratios, by means of which an electrical signal representing a resistance ratio set by means of the slider can be generated.

For example, such a circuit arrangement is generally known in which an adjustment control is connected with its two end connections to a direct-voltage source, one end connection being connected to a predetermined supply potential and the other end connection being connected to a reference potential, for example ground potential, and in which a direct-voltage value, which corresponds to the respective voltage divider ratio representing a resistance ratio set by means of the slider, is picked up via the slider of the adjustment control. In such a circuit arrangement, the electrical signal, which represents a resistance ratio set by means of the slider, is formed by means of a direct-voltage value, that is to say by an analog signal. Due to the continuously increasing significance of digital signal processing, however, there is an increasing requirement for circuit arrangements comprising an adjusting control including a slider, in which the signal which represents a resistance ratio set by means of the slider is formed by means of a digital signal in order to be able to process a signal representing a set resistance ratio in a digital manner, for example, by means of a microprocessor which operates in conjunction with the circuit arrangement containing the adjusting control. To obtain such a digital signal which represents a set resistance ratio of the adjusting control, the direct-voltage value picked up from the slider of the adjusting control in the known circuit arrangement can be supplied to a separate analog/digital converter circuit which converts this direct-voltage value into a digital data word signal. However, such an implementation requires a separate analog/digital converter circuit which represents an additional outlay and which is relatively expensive if it is constructed for the most accurate possible analog/digital conversion.

SUMMARY OF THE INVENTION

The invention aims to satisfy the abovementioned requirement by creating a circuit arrangement of the generic type initially specified, which is simply and inexpensively constructed and by means of which a digital signal representing a resistance ratio set by means of the slider can be generated in a simple and accurate manner. For this purpose, the invention is characterized by the fact that the two end connections of the adjusting control are each connected to one of two connections of a microprocessor and the slider of the adjusting control is connected to one connection of a capacitor, the other connection of which is connected to a predetermined potential, and that to each of the two connections of the microprocessor at least one switch controllable by the microprocessor is connected, by means of which optionally a first potential or a second potential can be connected to the connection connected to it, and that the microprocessor is constructed to execute a program run in which successively in a first program section one of the first and the second potentials is connected for a predetermined period of time to at least one of the two connections by means of the switch connected to it, in which arrangement the capacitor is brought into an initial charge state. In a second program section the other one of the first and the second potentials is connected to one of the two connections by means of the switch connected to it for recharging the capacitor via the one resistance section of the adjusting control located between this one connection and the slider, and a first measurement value is determined and stored which corresponds to a first recharging period, which is proportional to the value of this one resistance section, from the starting time of the recharging up to a time at which the potential at the connection of the capacitor connected to the slider reaches a predetermined potential value. In a third program section the one of the first and the second potential is again connected to at least one of the two connections by means of the switch connected to it for the predetermined period of time, during which process the capacitor is again brought into the initial charge state. In a fourth program section the other one of the first and the second potential is connected to the other one of the two connections by means of the switch connected to it for recharging the capacitor via the other resistance section of the adjusting control located between this other connection and the slider and a second measurement value is determined and stored which corresponds to a second recharging period, which is proportional to the value of this other resistance section, from the starting time of the recharging up to a time at which the potential at the connection of the capacitor connected to the slider again reaches the predetermined potential value. And in a fifth program section, by using the stored first measurement value and the stored second measurement value, a digital data word signal is generated by forming the quotient and is stored. This digital signal represents the resistance ratio set by means of the slider of the adjusting control.

In this manner, a circuit arrangement comprising an adjusting control having an adjustable slider is provided by means of which a digital signal representing a resistance ratio set by means of the slider can be generated and which exhibits a simple and inexpensive construction because a microprocessor, which is provided in any case for implementing a plurality of further tasks in a device or in a piece of equipment, respectively, is additionally utilized for generating the digital signal representing a set resistance ratio. Advantageously, this digital signal can be continuously newly-generated successively within short time intervals, for example in time intervals of 50 msec or even less, so that with each adjustment of the slider of the adjusting control a digital signal representing the resistance ratio just set is generated virtually immediately. In this connection, the digital signal representing a set resistance ratio, which signal is generated and stored in the microprocessor, is available unchanged for periods of any length and can be called up at any time, thus, advantageously, also repeatedly in succession within short time intervals for purposes provided in this respect. For example, such a circuit arrangement according to the invention comprising an adjusting control can be a component of an engine control circuit which is implemented at least partially in digital technology utilizing the microprocessor, in which the adjusting control is provided for setting a speed or, respectively, a nominal rotational speed, of an engine, the rotational speed of which can be controlled. Such a circuit arrangement according to the invention, however, can also be used advantageously in many other devices which are mainly implemented in digital technology, such as, for example, in remote control devices, in computer game devices or the like. It should also be noted at this point that an adjusting control is understood to be both a rotary potentiometer and a sliding control in which the slider adjustment can be effected in any manner, for example, manually with or without a tool or also with the aid of a motor.

To bring the capacitor in each case into its initial charge state, in the first and third program section the one of the first and the second potentials can be connected for a predetermined period of time to in each case only one of the connections of the microprocessor by means of the switch connected to this connection. In this arrangement, however, a relatively long period of time must then be selected for reliably bringing the capacitor into its initial charge state. It has therefore been found to be advantageous if the microprocessor is constructed for executing a program run in which in the first program section and in the first third program section, one of the first and the second potentials is connected for a predetermined period of time to both connections of the microprocessor by means of the switches connected to these connections, during which process the capacitor is brought into its initial charge state. The result of this is that the capacitor is reliably brought into its initial charge state within a relatively short period of time, which is advantageous with respect to the most rapid possible generation of the digital signal representing the set resistance ratio.

Two switches can be connected to each of the two connections of the microprocessor connected to the end connections of the adjusting control, in which arrangement the connection connected to the two switches can be connected to one of the first and the second potentials via one switch and to the other one of the first and the second potentials via the other switch. However, it has been found to be advantageous if the two end connections of the adjusting control are each permanently connected via a resistor to one of the first and the second potentials and the other one of the first and the second potentials can be connected to each of the two connections, connected to the end connections, of the microprocessor via only one switch per connection. The result of this is that sufficiency is found with only one switch for each of the two connections of the microprocessor.

The controllable switches connected to the two connections of the microprocessor can be formed by switches externally connected to the microprocessor, for example, by discrete switching transistors or by integrated analog switches. However, it has been found to be advantageous if the switches connected to the two connections of the microprocessor are formed by microprocessor-internal transistors. As a result, a particularly simple construction is obtained in which transistors, which are in any case contained in commercially available microprocessors, are utilized for carrying out the switching processes required in a circuit arrangement according to the invention.

BRIEF DESCRIPTION OF THE DRAWINGS

In the text which follows, the invention will be described in more detail with reference to some illustrative embodiments shown in the drawing, to which, however, it shall not be restricted.

DESCRIPTION OF THE PREFERRED EMBODIMENTS

Figure 1:
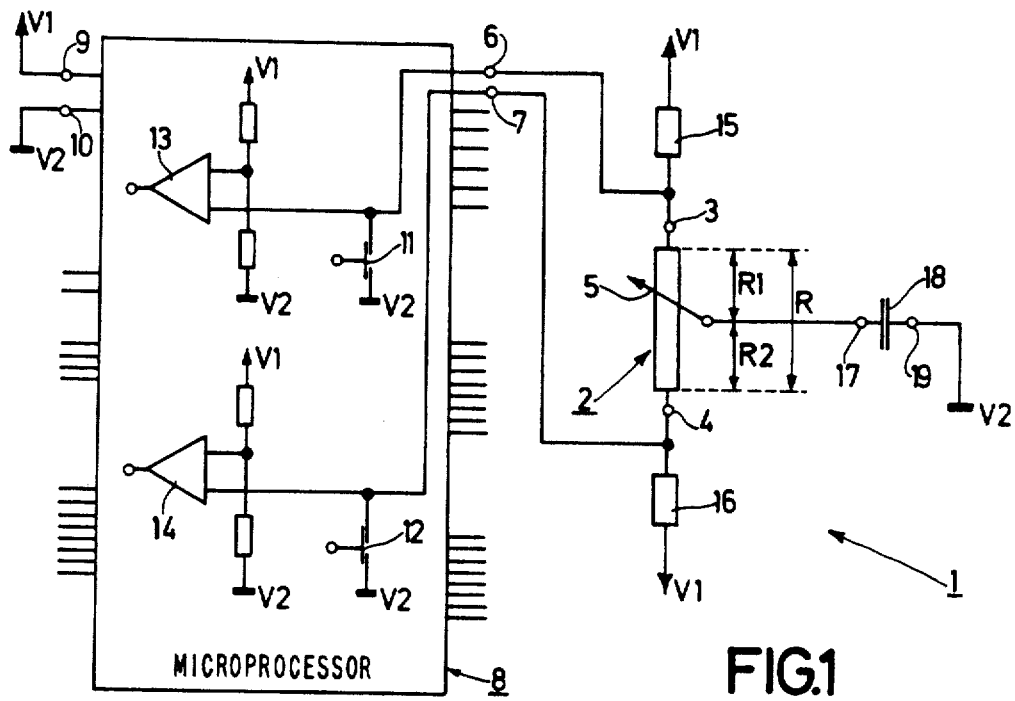
FIG. 1 shows a circuit arrangement according to a first illustrative embodiment comprising an adjusting control, the end connections of which are connected to two bidirectionally usable connections of a microprocessor, each of which can be connected to a reference potential via a microprocessor-internal switch, in which arrangement the end connections of the adjusting control are each connected via a resistor to a supply potential.

FIG. 1 shows a circuit arrangement 1 according to a first illustrative embodiment which includes an adjusting control 2 which is constructed, for example, as a rotary potentiometer. The adjusting control 2 has two end connections 3 and 4. Furthermore, the adjusting control 2 has a slider 5, which is adjustable between the two end connections 3 and 4, for setting different resistance ratios. As is specified in FIG. 1, the adjusting control 2 exhibits a total resistance value R which is located between its two end connections 3 and 4. The slider 5 can be used for setting different resistance ratios depending on its position so that a resistance section R1 is located between on end connection 3 and the slider 5 and a resistance section R2 is located between the other end connection 4 and the slider 5.

The circuit arrangement 1 can be used for generating a digital signal representing a resistance ratio set by means of the slider 5 of the adjusting control 2. For this purpose, the two end connections 3 and 4 of the adjusting control 2 are now each connected to one of two connections 6 and 7 of a microprocessor 8. These two connections 6 and 7 are bidirectionally usable signal connections which can be used both as inputs and as outputs. A first potential V1 and a second potential V2 are connected to the microprocessor 8 for supplying it with voltage via two further connections 9 and 10 which are supply connections. The first potential V1 is a supply potential and the second potential V2 is a reference potential, namely ground potential. The microprocessor 8 can be, for example, a microprocessor which is produced by the applicant and is commercially available under the type designation PCB80C51, which is constructed for connection to a supply potential of +5 V. The microprocessor 8 also exhibits a number of further connections which are diagrammatically indicated but which are not discussed in greater detail at this point because they do not have any function in the present connection.

The two connections 6 and 7 of the microprocessor 8 are each connected to one switch 11 and 12, respectively, which are controllable by the microprocessor 8, by means of which the first potential V1 or the second potential V2 can be optionally connected to the connection 6 or 7 of the microprocessor 8, which is connected to it, which will be explained in still greater detail in the text which follows. The two switches 11 and 12 in this arrangement are in each case formed in a simple manner by a microprocessor-internal transistor as is indicated diagrammatically in FIG. 1. The main current path of each of these transistors 11 and 12 is connected, on the one hand, to the relevant connection 6 or 7 of the microprocessor 8 and, on the other hand, to the second potential V2. For driving each transistor 11 and 12, its control electrode can be supplied with a corresponding control signal which is generated in the microprocessor 8. The connections 6 and 7 are furthermore connected to one input each of a microprocessor-internal voltage comparator 13 and 14, respectively, the other input of which is supplied with a reference potential via a voltage divider coupled between the first potential V1 and the second potential V2. The reference potential is, for example, the value V1/2, each comparator 13 and 14 emitting a detection signal at its output when the potential occurring at the input connected to a connection 6 or 7 reaches the potential value V1/2. However, the reference potential could also exhibit a potential value which is different from V1/2.

The two end connections 3 and 4 of the adjusting control 2 are each permanently connected via a resistor 15 and 16, respectively, to the first potential V1. The two resistors 15 and 16 suitably have the same resistance value which is advantageously greater by at least one order of magnitude than the resistance value R of the adjusting control 2. By opening the switches 11 and 12, that is to say when the transistors are driven into their non-conductive state, the first potential V1 is connected via the resistors 15 and 16 to the connections 6 and 7 of the microprocessor 8 and thus also to the end connections 3 and 4 of the adjusting control 2. By closing the switches 11 and 12, that is to say when the transistors are driven into their conductive state, the second potential V2 is connected via the switches 11 and 12 to the connections 6 and 7 of the microprocessor 8 and thus also to the end connections 3 and 4 of the adjusting control 2.

The slider 5 of the adjusting control 2 is connected to a connection 17 of a capacitor 18. The other connection 19 of the capacitor 18 is connected to a predetermined potential which, in the present case, is formed by the second potential V2, that is to say ground potential. The connection 19 of the capacitor 18, however, could also be connected to a potential which is different from the ground potential.

Figure 2:
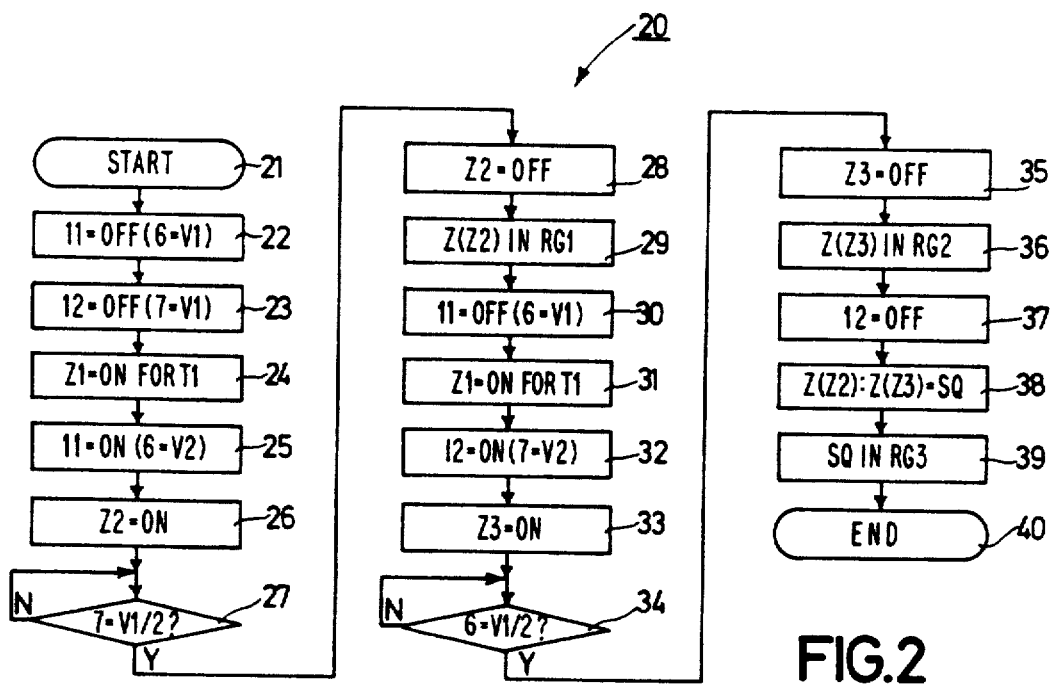
FIG. 2 shows a flow chart of a program run which is executed in the microprocessor of the circuit arrangement according to FIG. 1 in order to generate a digital signal which represents a resistance ratio set by means of the slider of the adjusting control.

As has already been mentioned, the circuit arrangement 1 can be used for generating a digital signal representing the resistance ratio set in each case. For generating this signal, the microprocessor 8 is constructed to execute a program run which is described with reference to the flow chart 20, shown in FIG. 2, in the text which follows.

This program run is started at block 21. At the subsequent block 22, the switch 11 is driven into its non-conductive state as a result of which the first potential V1 is connected to one connection 6 of the microprocessor 8 and to one end connection 3 of the adjusting control 2 via the resistor 15. After that, the switch 12 is also driven into its non-conductive state at block 23 as a result of which the first potential V1 is connected to the other connection 7 of the microprocessor 8 and to the other end connection 4 of the adjusting control 2 via the resistor 16. After that, an internal timer Z1 is started at block 24, which by counting up to a predetermined count, ensures that the states generated by the program steps at blocks 22 and 23 are maintained for a predetermined period T1 corresponding to the predetermined count and the execution of the next program step at block 25 is only enabled after the predetermined period of time T1 has elapsed. By connecting the first potential V1 to the two end connections 3 and 4 of the adjusting control 2, the capacitor 18 is relatively rapidly charged both via the resistor 15 and the one resistance section R1 and via the resistor 16 and the other resistance section R2, in which process the potential rises at the connection 17 of the capacitor 18 connected to the slider 5. As a result of this, the capacitor 18 is brought into an initial charge state in which it is charged. The predetermined period of time T1 in this arrangement is selected in such a manner that the capacitor 18 is reliably brought into its initial charge state.

After the predetermined period of time T1 has elapsed, the switch 11 is driven into its conductive state at block 25, as a result of which the second potential V2 is connected to one connection 6 of the microprocessor 8 and to one end connection 3 of the adjusting control 2, which serves to recharge the capacitor 18 via the one resistance section R1, which is located between this one connection 6 and the slider 5, of the adjusting control 2 and the now conductive switch 11. Due to this recharging of the capacitor 18 in the present case, the latter is discharged during which process the potential drops at its connection 17 connected to the slider 5. Although it is true that during this discharging process of the capacitor 18, the latter is actually also charged via the resistor 16 and the other resistance section R2 because the switch 12 is in its non-conductive state, this influence is negligible because of the high resistance value of the resistor 16. At the subsequent block 26, a timer Z2 is started which means that this timer Z2 is virtually started at the starting time of the recharging of the capacitor 18 triggered at the preceding block 25. After that, it is checked at block 27 whether the potential occurring at the other connection 7 of the microprocessor 8, which here essentially corresponds to the potential at the connection 17 of the capacitor 18 connected to the slider 5, has reached the predetermined reference potential V1/2. This checking is effected with the aid of the comparator 14 connected to the other connection 7.

As long as the potential at the other connection 7 is higher than the reference potential V1/2, the program run is continued at block 27. When the potential at the other connection 7 has reached the value V1/2, the comparator 14 outputs a detection signal at its output which corresponds to a positive test result at block 27. The program run is thereupon continued at block 28 at which the timer Z2 is stopped which then exhibits a particular count Z(Z2). After that, the count Z(Z2) of the counter Z2 is stored in a register RG1 at block 29. The stored count Z(Z2) represents a first measurement value. This first measurement value corresponds to a first recharging period TU1 which is proportional to the resistance value of the one resistance section R1 and the capacitance value of the capacitor 18, from the starting time of recharging, triggered at block 25, up to a time at which the potential at the connection 17 of the capacitor 18 connected to the slider 5 has reached the predetermined potential value V1/2.

At the subsequent block 30, the switch 11 is again driven into its non-conductive state as a result of which the first potential V1 is again connected to one connection 6 of the microprocessor 8 and to one end connection 3 of the adjusting control 2 via the resistor 15. Since during this process the other switch 12 is also in its non-conductive state, as a result of which the first potential V1 is also connected to the other connection 7 of the microprocessor 8 and the other end connection 4 of the adjusting control 2 via the resistor 16, the capacitor 18 is relatively rapidly charged analogously to blocks 22 and 23, during which process the potential at the connection 17 of the capacitor 18 connected to the slider 5 rises. As a result, the capacitor 18 is again brought into its initial charge state in which it is charged. At the subsequent block 31, the internal timer Z1 is started analogously to block 24, by means of which it is again ensured that the execution of the next program step at block 32 is only enabled after the predetermined period of time T1 has elapsed.

After the predetermined period of time T1 has elapsed, the switch 12 is driven into its conductive state at block 32 as a result of which the second potential V2 is connected to the other connection 7 of the microprocessor 8 and to the other end connection 4 of the adjusting control 2, which serves to recharge the capacitor 18 via the other resistance section R2, which is located between this other connection 7 and the slider 5, of the adjusting control 2 and the now conductive switch 12. As a result, the capacitor 18 is discharged again, during which process the potential drops at its connection 17 connected to the slider 5. Although it is true that during this discharging process of the capacitor 18 the latter is actually also charged via the resistor 15 and the one resistance section R1 because the switch 11 is in its non-conductive state, this influence is negligible due to the high resistance value of the resistor 15. At the subsequent block 33, a timer Z3 is started which means that this timer Z3 is virtually started at the starting time of the recharging of the capacitor 18 triggered at the preceding block 32. After that, it is checked at block 34 whether the potential occurring at the one connection 6 of the microprocessor 8, which here also essentially corresponds to the potential at the connection 17 of the capacitor 18 connected to the slider 5, has reached the predetermined reference potential V1/2. This checking is effected with the aid of the comparator 13 connected to the one connection 6. As long as the reference potential V1/2 has not been reached and the potential at the one connection 6 is higher than the reference potential V1/2, the program run is continued at block 34. When, however, the potential at the one connection 6 of the microprocessor 8 has reached the value V1/2, the comparator 13 outputs a detection signal which corresponds to a positive test result at block 34. The program run is thereupon continued at block 35 at which the timer Z3 is stopped which then exhibits a particular count Z(Z3). After that, the count Z(Z3) of the counter Z3 is stored in a register RG2 at block 36. The stored count Z(Z3) represents a second measurement value. This second measurement value corresponds to a second recharging period TU2, which is proportional to the resistance value of the other resistance section R2 and the capacitance value of the capacitor 18, from the starting time of recharging, triggered at block 32, up to a time at which the potential at the connection 17 of the capacitor 18 connected to the slider 5 has reached the predetermined potential value V1/2. At the subsequent block 37, the switch 12 is again driven into its non-conductive state as a result of which the first potential V1 is again connected to the other connection 7 of the microprocessor 8 via the resistor 16.

At the subsequent block 38, a digital data word signal SQ is generated, using the first measurement value Z(Z2) stored in register RG1 at block 29 and the second measurement value Z(Z3) stored in register RG2 at block 36 by forming the quotient of the first measurement value Z(Z2) and the second measurement value Z(Z3). At the subsequent block 39, the digital data word signal SQ generated is stored in a register RG3. This digital data word signal SQ which, in the present case, was generated with the aid of the quotient of the first measurement value Z(Z2), which is proportional to the one resistance section R1, and the second measurement value Z(Z3), which is proportional to the other resistance section R2, represents the resistance ratio R1:R2, set by means of the slider 5, between the one resistance section R1 and the other resistance section R2 of the adjusting control 2. The value of this digital data word signal SQ in this arrangement is advantageously independent of the capacitance value of the capacitor 18 and is also independent of the total resistance value R of the adjusting control 2 due to the forming of the quotient. The program run 20 is terminated at the subsequent block 40 according to FIG. 2.

In the circuit arrangement 1 according to FIG. 1, the microprocessor 8 can also be constructed to execute a program run in which at block 38, using the two stored measurement values Z(Z2) and Z(Z3), a digital data word signal SQ is generated by forming the quotient of the first measurement value Z(Z2) and the sum of the two measurement values Z(Z2) and Z(Z3) or, respectively, by forming the quotient of the second measurement value Z(Z3) and the sum of the two measurement values Z(Z2) and Z(Z3), in which arrangement this digital data word signal SQ generated then represents the resistance ratio R1:R between the one resistance section R1 and the total resistance R of the adjusting control or, respectively, the resistance ratio R2:R between the other resistance section R2 and the total resistance R of the adjusting control.

Figure 3:
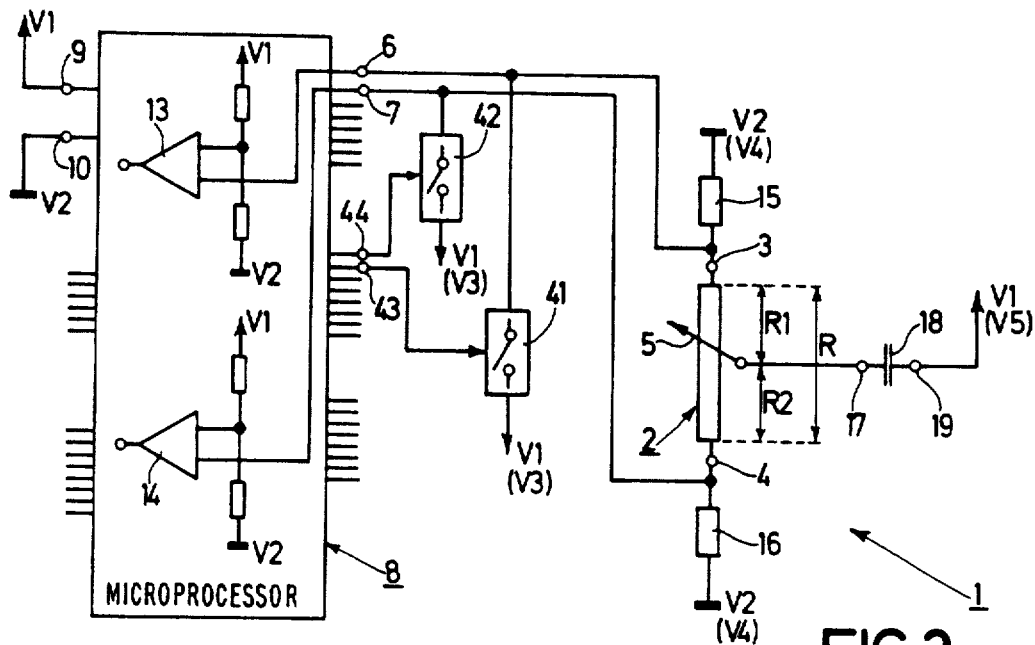
FIG. 3 shows a circuit arrangement according to a second illustrative embodiment comprising an adjusting control, the end connections of which are connected to two unidirectionally usable connections of a microprocessor which are each connected to a switch which is external to the microprocessor, via which the two connections of the microprocessor can be connected to a supply potential, the end connections of the adjusting control being connected to a reference potential via one resistor each.

In FIG. 3, another circuit arrangement 1 according to a second illustrative embodiment comprising an adjusting control 2 is shown which represents a modification of the circuit arrangement according to FIG. 1. In the circuit arrangement 1 according to FIG. 3, the two end connections 3 and 4 of the adjusting control 2 are each connected to one of two connections 6 and 7 of a microprocessor 8 which are unidirectional signal connections which can only be used as inputs. The two connections 6 and 7 are each connected to a microprocessor-internal voltage comparator 13 and 14, respectively. The connections 6 and 7 are also each connected to a switch 41 and 42, respectively, which is shown diagrammatically and is external to the microprocessor 8. The two switches 41 and 42 can be formed, for example, by means of switching transistors. The two switches 41 and 42 are each connected at their ends facing away from the connections 6 and 7 to the first potential V1. The two switches 41 and 42 can be controlled by the microprocessor 8 for which purpose the control inputs of these two switches 41 and 42 are connected to one each of two further connections 43 and 44, respectively, of the microprocessor 8. The two connections 43 and 44 are unidirectional signal connections which can only be used as outputs.

In the circuit arrangement 1 according to FIG. 3, the resistors 15 and 16 connected to the end connections 3 and 4 of the adjusting control 2 are each connected at their ends facing away from the adjusting control 2 to the second potential V2. The connection 19 of the capacitor 18, facing away from the slider 5 of the adjusting control 2, is connected to the first potential V1 but could also be connected to a potential differing from the first potential V1.

Figure 4:
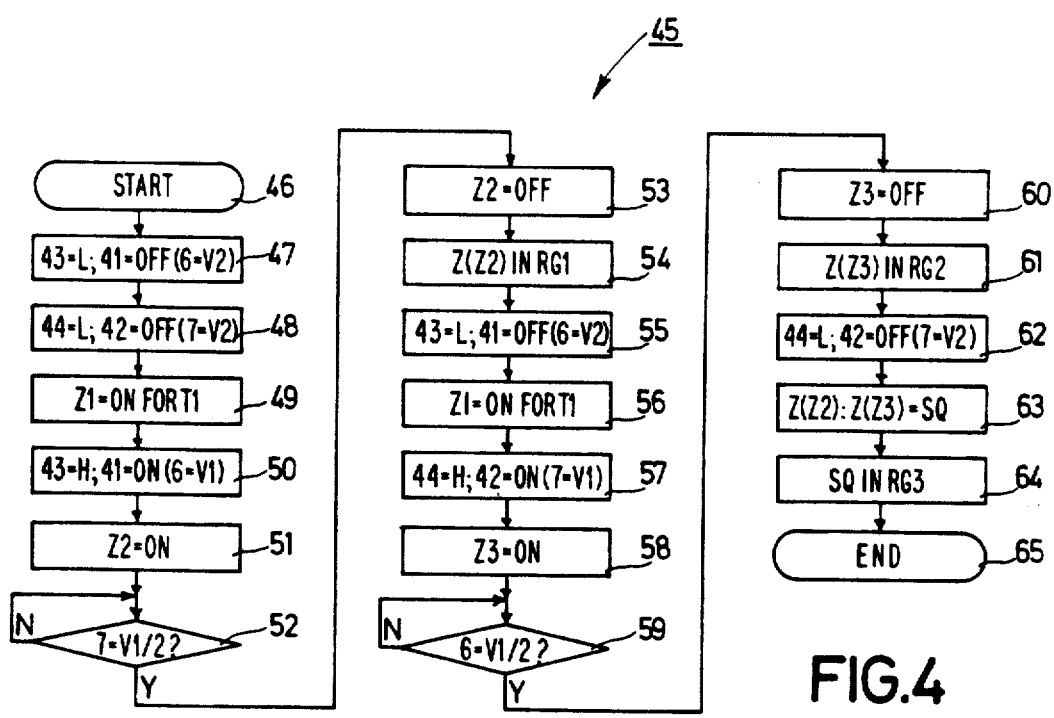
FIG. 4 shows a flow chart of a program run which is executed in the microprocessor of the circuit arrangement according to FIG. 3 in order to generate a digital signal which represents a resistance ratio set by means of the slider of the adjusting control.

For generating a digital signal representing the resistance ratio set in each case, the microprocessor 8 of the circuit arrangement 1 according to FIG. 3 is constructed to execute a program run which is described in the text which follows, referring to the flow chart 45 shown in FIG. 4.

This program run is started at block 46. At the subsequent block 47, the microprocessor 8 outputs at its output 43 a control signal which drives the switch 41 into its non-conductive state as a result of which the second potential V2 is connected to one connection 6 of the microprocessor 8 and to one end connection 3 of the adjusting control 2 via the resistor 15. At the subsequent block 48, the microprocessor 8 outputs at its output 44 a control signal which drives the switch 42 into its non-conductive state as a result of which the second potential V2 is connected to the other connection 7 of the microprocessor 8 and to the other end connection 4 of the adjusting control 2 via the resistor 16. After that, an internal timer Z1 is started for a predetermined period of time T1 at block 49 analogously to block 24 according to FIG. 2. By connecting the second potential V2 to the two end connections 3 and 4 of the adjusting control 2, the capacitor 18 is charged relatively rapidly and, as a result, is brought into an initial charge state in which its connection 19 exhibits the first potential V1 and its connection 17 exhibits the second potential V2.

After the predetermined period of time T1 has elapsed, the microprocessor 8 outputs at its output 43 at block 50 a control signal which drives the switch 41 into its conductive state as a result of which the first potential V1 is connected to one connection 6 of the microprocessor 8 and to the one end connection 3 of the adjusting control 2 which serves to recharge the capacitor 18 via the one resistance section R1 of the adjusting control 2, which is located between this one connection 6 and the slider 5, and the now conductive switch 41. Due to this recharging of the capacitor 18, the latter is discharged and therefore the potential at connection 17 of the capacitor increases. At the subsequent block 51, a timer Z2 is started analogously to block 26 according to FIG. 2. After that, it is checked at block 52, analogously to block 27 according to FIG. 2, whether the potential occurring at the other connection 7 of the microprocessor 8 has reached the predetermined reference potential V1/2. As long as this is not the case, the program run is continued at block 52. If this is the case, however, the program run is continued at block 53 at which the timer Z2 is stopped and which then exhibits a particular count Z(Z2). After that, the count Z(Z2) of the timer Z2 is stored in a register RG1 at block 54. The stored count Z(Z2) represents a first measurement value. This first measurement value corresponds to a first recharging period TU1 which is proportional to the resistance value of the one resistance section R1 and to the capacitance value of the capacitor 18 and which elapses between the starting time of the recharging and a time at which the potential at the connection 17 of the capacitor 18 connected to the slider 5 has reached the predetermined potential value V1/2.

After that, the microprocessor 8 outputs at its output 43 at block 55 a control signal which drives the switch 41 into its non-conductive state as a result of which the second potential V2 is again connected to the one connection 6 of the microprocessor 8 and to the one end connection 3 of the adjusting control 2 via the resistor 15. Since during this process, the switch 42 is also in its non-conductive state as a result of which the second potential V2 is also connected to the other connection 7 of the microprocessor 8 and to the other end connection 4 of the adjusting control 2 via the resistor 16, the capacitor 18 is again charged relatively rapidly and, as a result, is brought back into its initial charge state. At the subsequent block 56, the internal timer Z1 is started for the predetermined period of time T1 analogously to block 49.

After the predetermined period of time T1 has elapsed, the microprocessor 8 outputs at its output 44 at block 57 a control signal which drives the switch 42 into its conductive state as a result of which the first potential V1 is connected to the other connection 7 of the microprocessor 8 and to the other end connection 4 of the adjusting control 2, which serves to recharge the capacitor 18 via the resistance section R2 of the adjusting control 2, which is located between this other connection 7 and the slider 5, and the now conductive switch 42. During this recharging process, the capacitor 18 is discharged and the potential at the connection 17 of the capacitor 18 thus rises. At the subsequent block 58, a timer Z3 is started analogously to block 33 according to FIG. 2. After that, it is checked at block 59, analogously to block 34 according to FIG. 2, whether the potential occurring at the one connection 6 of the microprocessor 8 has reached the predetermined reference potential V1/2. As long as this is not the case, the program run is continued at block 59. If this is the case, however, the program run is continued at block 60. At block 60, the timer Z3 is stopped which then exhibits a particular count Z(Z3). After that, the count Z(Z3) of the timer Z3 is stored in a register RG2 at block 61. The stored count Z(Z3) represents a second measurement value. This second measurement value corresponds to a second recharging period TU2, which is proportional to the resistance value of the other resistance section R2 and the capacitance value of the capacitor 18 and which elapses between the starting time of the recharging and a time at which the potential at the connection 17 of the capacitor 18 connected to the slider 5 has reached the predetermined potential value V1/2. At the subsequent block 62, the microprocessor 8 outputs at its output 44 a control signal which again drives the switch 42 into its non-conductive state as a result of which the second potential V2 is again connected to the other connection 7 of the microprocessor 8 and to the other end connection 4 of the adjusting control 2 via the resistor 16.

At the subsequent block 63, using the first measurement value Z(Z2) stored in register RG1 at block 54 and the second measurement value Z(Z3) stored in register RG2 at block 61, a digital data word signal SQ is generated by forming the quotient of the first measurement value Z(Z2) and the second measurement value Z(Z3). The digital data word signal SQ generated is stored in a register RG3 at the subsequent block 64. This data word signal SQ, which, in the present case, has been generated with the aid of the quotient of the first measurement value Z(Z2), which is proportional to the one resistance section R1, and the second measurement value Z(Z3), which is proportional to the other resistance section R2, represents the resistance ratio R1:R2, set by means of the slider 5, between the one resistance section R1 and the other resistance section R2 of the adjusting control 2. The program run 45 according to FIG. 4 is ended at the subsequent block 65.

It should be mentioned at this point that the switches 41 and 42 and the capacitor 18 with its connection 19 do not necessarily have to be connected to the first potential V1 which is supplied as supply potential to the microprocessor 8 at its connection 9 and the resistors 15 and 16 do not necessarily have to be connected to the second potential V2 which is supplied as reference potential to the microprocessor 8 at its connection 10. For example, the switches 41 and 42 could also be connected to a potential V3, the resistors 15 and 16 to a potential V4 and the capacitor 18 with its connection 19 to a potential V5, as is indicated in FIG. 3 in parentheses.

Figure 5:
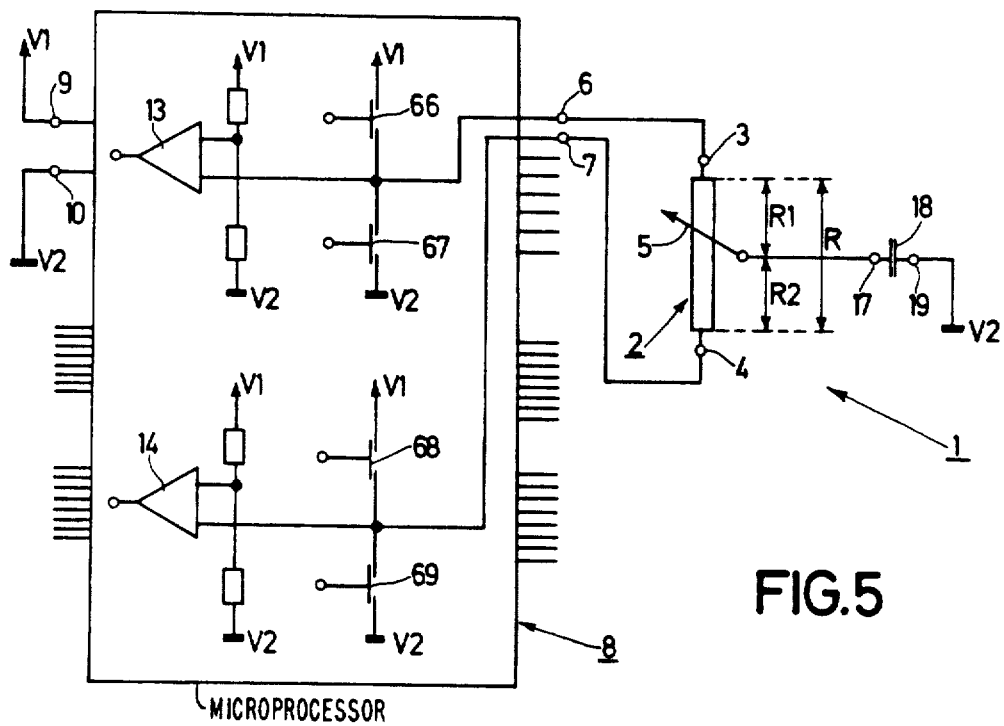
FIG. 5 shows a circuit arrangement according to a third illustrative embodiment comprising an adjusting control, the two end connections of which are connected to two bidirectionally usable connections of a microprocessor which can each be connected via two microprocessor-internal switches either to a supply potential or to a reference potential.

In FIG. 5, a circuit arrangement 1 according to a third illustrative embodiment is shown and which includes an adjusting control 2, the end connections 3 and 4 of which are exclusively each connected to one of two connections 6 and 7 of a microprocessor 8. These two connections 6 and 7 are bidirectionally usable signal connections which can be used both as inputs and as outputs. Each of the two connections 6 and 7 are connected to a microprocessor-internal comparator 13 and 14, respectively. The connections 6 and 7 are also each connected to two switches 66 and 67, and 68 and 69, respectively. The switches 66, 67, 68 and 69 in this arrangement are formed in a simple manner by microprocessor-internal transistors. The switch 66 and the switch 68 are each connected at their ends facing away from the connections 6 and 7 to the first potential V1. The switch 67 and the switch 69 are each connected at their ends facing away from the connections 6 and 7 to the second potential V2.

Figure 6:
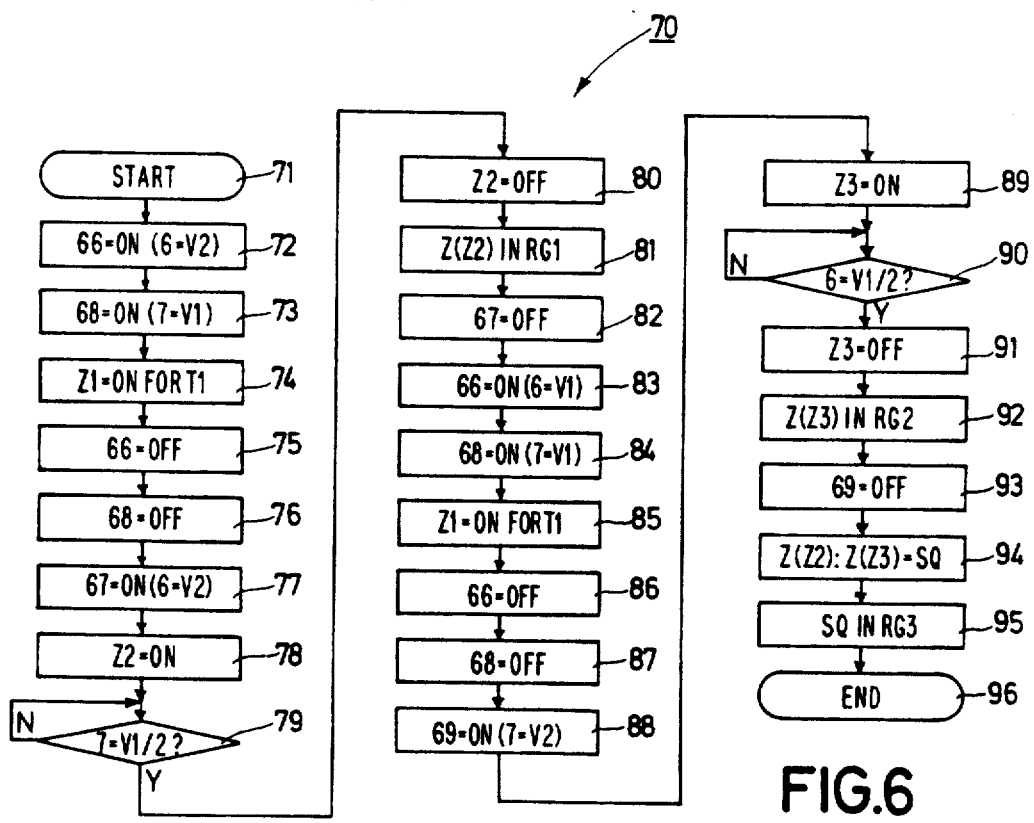
FIG. 6 shows a flow chart of a program run which is executed in the microprocessor of the circuit arrangement according to FIG. 5 in order to generate a digital signal which represents a resistance ratio set by means of the slider of the adjusting control.

For generating a digital signal representing the resistance ratio set in each case, the microprocessor 8 of the circuit arrangement 1 according to FIG. 5 is constructed to execute a program run which is described in the text which follows, referring to the flow chart 70 shown in FIG. 6.

This program run is started at block 71. It shall be assumed that the switches 66, 67, 68 and 69 are all in their non-conductive state at the start of this program run. At the subsequent block 72, the switch 66 is driven into its conductive state. At the subsequent block 73, the switch 68 is driven into its conductive state. As a result, the first potential V1 is connected both to the one connection 6 of the microprocessor 8 and to the end connection 3 of the adjusting control 2 and to the other connection 7 of the microprocessor 8 and to the end connection 4 of the adjusting control 2. At the subsequent block 74, a timer Z1 is started for a predetermined period of time T1 analogously to block 24 according to FIG. 2 and to block 49 according to FIG. 4. By connecting the first potential V1 to the two end connections 3 and 4 of the adjusting control 2, the capacitor 18 is rapidly charged both via the one resistance section R1 and via the other resistance section R2 and thus is brought into an initial charge state in which its connection 17 exhibits the first potential V1 and its connection 19 exhibits the second potential V2. After the predetermined period of time T1 has elapsed, the switch 66 is driven into its non-conductive state at block 75. At the subsequent block 76, the switch 68 is driven into its non-conductive state. As a result, the first potential V1 is disconnected from the connections 6 and 7 of the microprocessor 8 and the end connections 3 and 4 of the adjusting control 2.

At the subsequent block 77, the switch 67 is driven into its conductive state as a result of which the second potential V2 is connected to the one connection 6 of the microprocessor 8 and to the one end connection 3, connected to the latter, of the adjusting control 2, which serves to recharge the capacitor 18 via the one resistance section R1 of the adjusting control 2, located between this one connection 6 and the slider 5, and the now conductive switch 67. Due to this recharging, the capacitor 18 is discharged during which process the potential drops at the connection 17 of the capacitor 18 connected to the slider 5. At the subsequent block 78, a counter Z2 is started analogously to block 26 according to FIG. 2 and to block 51 according to FIG. 4. At the subsequent block 79, it is checked whether the potential occurring at the other connection 7 of the microprocessor 8, which corresponds to the potential at the connection 17 of the capacitor 18 connected to the slider 5, has reached the predetermined reference potential V1/2. As long as this is not the case, the program run is continued at block 79. If this is the case, however, the program run is continued at block 80 at which the timer Z2 is stopped when it then exhibits a particular count Z(Z2). After that, the count Z(Z2) of the timer Z2 is stored in a register RG1 at block 81. The stored count Z(Z2) represents a first measurement value. This first measurement value corresponds to a first recharging period TU1 which is proportional to the resistance value of the one resistance section R1 and the capacitance value of the capacitor 18 and which elapses between the starting time of the recharging and a time at which the potential at the connection 17 of the capacitor 18 connected to the slider 5 has reached the predetermined potential value V1/2. At the subsequent block 82, the switch 67 is driven back into its non-conductive state as a result of which the second potential V2 is disconnected from the one connection 6 of the microprocessor 8 and the one end connection 3 of the adjusting control 2.

At the subsequent block 83, the switch 66 is driven into its conductive state analogously to block 72. After that, the switch 68 is driven into its conductive state at block 84, analogously to block 73. After that, the timer Z1 is started for the predetermined period of time T1 at block 85, analogously to block 74. By executing blocks 83, 84 and 85, the first potential V1 is again connected to the connections 6 and 7 of the microprocessor 8 and to the end connections 3 and 4 of the adjusting control 2 and the capacitor 18 is rapidly charged via the resistance sections R1 and R2 and thus is brought into its initial charge state at which the connection 17 exhibits the first potential V1 and the connection 19 exhibits the second potential V2. After the predetermined period of time T1 has elapsed, the switch 66 is driven back into its non-conductive state at block 86, analogously to block 75. At the subsequent block 87, the switch 68 is driven into its non-conductive state analogously to block 76. By executing blocks 86 and 87, the first potential V1 is disconnected from the connections 6 and 7 of the microprocessor 8 and the end connections 3 and 4 of the adjusting control 2.

At the subsequent block 88, the switch 69 is driven into its conductive state as a result of which the second potential V2 is connected to the other connection 7 of the microprocessor 8 and the other end connection 4, connected to the latter, of the adjusting control 2, which serves to recharge the capacitor 18 via the other resistance section R2, located between this other connection 7 and the slider 5, of the adjusting control 2 and the now conductive switch 69. As a result, the capacitor 18 is discharged during which process the potential drops at its connection 17 connected to the slider 5. At the subsequent block 89, a timer Z3 is started. At the subsequent block 90, it is checked whether the potential occurring at the one connection 6 of the microprocessor 8, which in this connection corresponds to the potential at the connection 17 of the capacitor 18 connected to the slider 5, has reached the predetermined reference potential V1/2. As long as this is not the case, the program run is continued at block 90. If this is the case, however, the program run is continued at block 91 at which the timer Z3 is stopped and which then exhibits a particular count Z(Z3). After that, the count Z(Z3) of the timer Z3 is stored in a register RG2 at block 92. The stored count Z(Z3) represents a second measurement value. This second measurement value corresponds to a second recharging period TU2 which is proportional to the resistance value of the other resistance section R2 and the capacitance value of the capacitor 18 and which elapses between the starting time of the recharging and a time at which the potential at the connection 17 of the capacitor 18, connected to the slider 5, has reached the predetermined potential value V1/2. At the subsequent block 93, the switch 69 is driven back into its non-conductive state as a result of which the second potential V2 is disconnected from the other connection 7 of the microprocessor 8 and the other end connection 4 of the adjusting control 2.

At the subsequent block 94, using the first measurement value Z(Z2) stored in register RG1 at block 81 and the second measurement value Z(Z3) stored in register RG2 at block 92, a digital data word signal SQ is generated by forming the quotient of the first measurement value Z(Z2) and the second measurement value Z(Z3). At the subsequent block 95, the digital data word signal SQ generated is stored in a register RG3. This digital data word signal SQ, which has been generated with the aid of the quotient of the first measurement value Z(Z2) proportional to the one resistance section R1 and the second measurement value Z(Z3) proportional to the other resistance section R2, represents the resistance ratio R1:R2, set by means of the slider 5, between the one resistance section R1 and the other resistance section R2 of the adjusting control 2. The program run 70 according to FIG. 6 is ended at the subsequent block 96.

Figure 7:
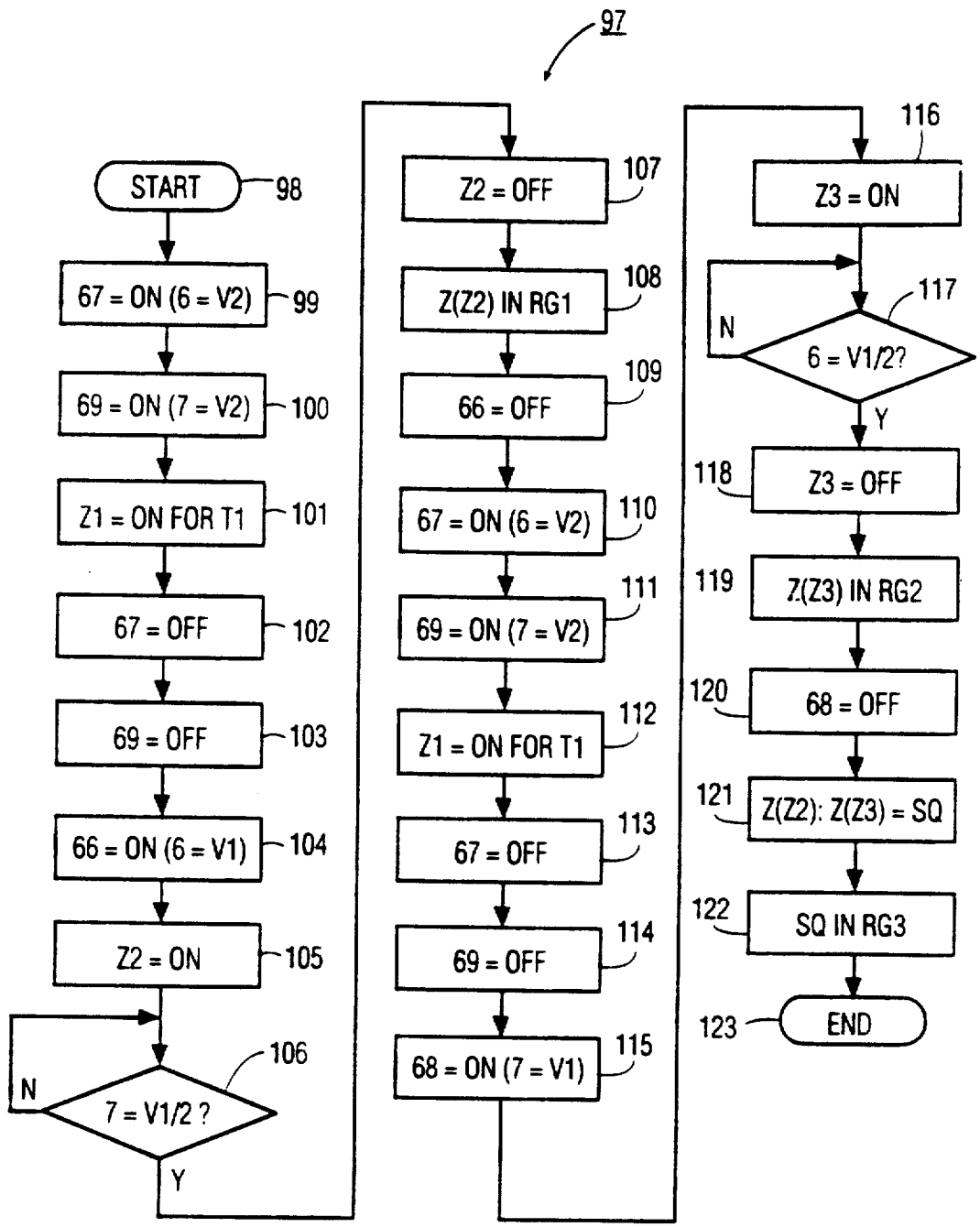
FIG. 7 shows a flow chart of a further program run which, with appropriate different construction, can be executed in the microprocessor of the circuit arrangement according to FIG. 5 in order to generate a digital signal which represents a resistance ratio set by means of the slider of the adjusting control.

For generating a digital signal representing the resistance ratio set in each case, the microprocessor 8 of the circuit arrangement 1 according to FIG. 5 could also be constructed for executing a program run which is described in the text which follows, referring to the flow chart 97 shown in FIG. 7.

This program run is started at block 98. At block 99, the switch 67 is driven into a conductive state. At block 100, the switch 69 is driven into its conductive state. After that, a timer Z1 is started for the predetermined period of time T1 at block 101. By executing blocks 99, 100 and 101, the second potential V2 is connected to the connections 6 and 7 of the microprocessor 8 and, as a result, the capacitor 18 is rapidly brought, in this case by discharging it, into an initial charge state at which its two connections 17 and 19 each exhibit the second potential V2. At the subsequent block 102, the switch 67 is driven back into its non-conductive state. At the subsequent block 103, the switch 69 is driven into its non-conductive state. By executing blocks 102 and 103, the second potential V2 is disconnected from the connections 6 and 7 of the microprocessor 8.

At subsequent block 104, the switch 66 is driven into its conductive state as a result of which the first potential V1 is connected to the one connection 6 of the microprocessor 8 and the capacitor 18 is rapidly charged via the switch 66 and the one resistance section R1, during which process the potential rises at its connection 17. After that, a timer Z2 is started at block 105. After that, it is checked at block 106 whether the potential occurring at the other connection 7 of the microprocessor 8 has reached the predetermined reference potential V1/2. As long as this is not the case, the program run is continued at block 106. If this is the case, however, the program run is continued at block 107 at which the timer Z2 is stopped, which then exhibits a particular count Z(Z2). At the subsequent block 108, the count Z(Z2) of the timer Z2 is stored in a register RG1. The count Z(Z2) represents a first measurement value as has already been explained with reference to block 81 according to FIG. 6. After that, the switch 66 is driven back into its non-conductive state at block 109, as a result of which the first potential V1 is disconnected from the one connection 6 of the microprocessor 8.

After that, the switch 67 is driven back into its conductive state at block 110. After that, the switch 69 is driven back into its conductive state at block 111. After that, the timer Z1 is started for the predetermined period of time T1 at block 112. By executing the blocks 110, 111 and 112, the second potential V2 is again connected to the connections 6 and 7 of the microprocessor 8 and, as a result, the capacitor 18 is rapidly discharged and again brought into its initial charge state at which its two connections 17 and 19 each exhibit the second potential V2. After that, the switch 67 is driven back into its non-conductive state at block 113. After that, the switch 69 is driven back into its non-conductive state at block 114. By executing blocks 113 and 114, the second potential V2 is disconnected from the connections 6 and 7 of the microprocessor 8.

At the subsequent block 115, the switch 68 is driven into its conductive state. As a result, the first potential V1 is connected to the other connection 7 of the microprocessor 8 via the switch 68 and the capacitor 18 is rapidly charged via the switch 6 and the other resistance section R2, during which process the potential rises at its connection 17. After that, a timer Z3 is started at block 116. After that, it is checked at block 117 whether the potential occurring at the one connection 6 of the microprocessor 8 has reached the predetermined reference potential V1/2. As long as this is not the case, the program run is continued at block 117. If this is the case, however, the program run is continued at block 118 at which the timer Z3 is stopped, which then exhibits a particular count Z(Z3). After that, the count Z(Z3) of the timer Z3 is stored in a register RG2 at block 119. The stored count Z(Z3) represents a second measurement value as has already been explained with reference to block 92 according to FIG. 6. At the subsequent block 120, the switch 68 is driven back into its non-conductive state as a result of which the first potential V1 is disconnected from the other connection 7 of the microprocessor 8.

At the subsequent block 121, using the first measurement value Z(Z2) stored in register RG1 at block 108 and the second measurement value Z(Z3) stored in register RG2 at block 119, a digital data word signal SQ is generated by forming the quotient of the first measurement value Z(Z2) and the second measurement value Z(Z3). At the subsequent block 122, the digital data word signal SQ generated is stored in a register RG3. This digital data word signal SQ again represents the resistance ratio R1:R2, set by means of the slider 5, between the one resistance section R1 and the other resistance section R2 of the adjusting control 2. The program run 97 according to FIG. 7 is ended at the subsequent block 123.

As can be seen from FIGS. 1, 3 and 5, the circuit arrangements described above, by means of which in each case a digital signal can be generated which represents the resistance ratio of the adjusting control set in each case, exhibit a very simple construction which additionally is also very inexpensive since a microprocessor, which is in any case provided for other purposes in a device or in a piece of equipment, is utilized for generating the digital signal which represents a set resistance ratio.

I claim:

1. A circuit arrangement comprising; an adjusting control having two end connections and an adjustable slider for setting different resistance ratios whereby an electrical signal representing a resistance ratio set by the slider can be generated, characterized in that the two end connections of the adjusting control are each connected to a respective one of two connections of a microprocessor and the slider is connected to one connection of a capacitor, the other capacitor connection being connected to a predetermined potential, and in that to each of the two microprocessor connections at least one respective switch controllable by the microprocessor is connected, by means of which a first potential or a second potential can be connected to the respective microprocessor connection, and in that the microprocessor executes a program run in which successively in a first program section one of the first and the second potentials is connected for a predetermined period of time to at least one of the two connections via its respective switch whereby the capacitor is brought into an initial charge state, in a second program section the other one of the first and second potentials is connected to one of the two connections via its respective switch for recharging the capacitor via one resistance section of the adjusting control located between the one connection and the slider, and a first measurement value is determined and stored which corresponds to a first recharging period, from the starting time of the recharging up to a time at which a potential at the one connection of the capacitor reaches a predetermined potential value, which first recharging period is proportional to the value of the one resistance section, in a third program section the one of the first and second potentials is again connected to at least one of the two connections via its respective switch for the predetermined period of time during which the capacitor is again brought into the initial charge state, in a fourth program section the other one of the first and second potentials is connected to the other one of the two connections via its respective switch for recharging the capacitor via the other resistance section of the adjusting control located between said other connection and the slider and a second measurement value is determined and stored which corresponds to a second recharging period, from the starting time of the recharging up to a time at which the potential at the one connection of the capacitor again reaches the predetermined potential value, which second recharging period is proportional to the value of the other resistance section, and in a fifth program section, using the stored first measurement value and the stored second measurement value, a digital data word signal is generated by forming the quotient thereof and said digital data signal is stored, and wherein the digital signal represents a resistance ratio set by the slider of the adjusting control.

2. A circuit arrangement according to claim 1, wherein the microprocessor executes a program run in which, in the first program section and in the third program section, one of the first and second potentials is connected for a predetermined period of time to both connections of the microprocessor by means of the respective switches connected to said connections, during which time the capacitor is brought into its initial charge state.

3. A circuit arrangement according to claim 1, wherein the two end connections of the adjusting control are each permanently connected via a resistor to one of the first and second potentials and the other one of the first and second potentials can be connected to each of the two connections of the microprocessor, via only one switch per connection.

4. A circuit arrangement according to claim 1, wherein the switches connected to the two connections of the microprocessor comprise microprocessor-internal transistors.

5. An apparatus for digitally representing the setting of an adjustable variable impedance device comprising:
first and second supply terminals for connection to a first potential and a second potential, respectively,
an adjustable variable impedance device having first and second terminals for connection to at least one terminal of said first and second supply terminals, said variable impedance device having a third terminal connected to an adjustment member thereof by which the impedance ratio of first and second sections of the variable impedance device can be adjusted to a desired setting,
a capacitor connected to said third terminal of the variable impedance device and to a point of reference voltage,
first and second switches controllable by a digital control unit, and a digital control unit having first and second terminals connected to said first and second terminals, respectively, of the variable impedance device, and via said first and second controllable switches to at least one of said first and second supply terminals so that the first and second potentials can be selectively coupled to the first and second terminals of the control unit, wherein the control unit controls said first and second controllable switches via a preset program which causes the capacitor to charge to an initial state of charge, then to discharge the capacitor to a given voltage level via said first section of the variable impedance device and to measure and store in a digital memory of the control unit a first digital value corresponding to the time for the capacitor to discharge to the given voltage level, subsequently to cause the capacitor to charge to said initial state of charge, then to discharge the capacitor to the given voltage level via said second section of the variable impedance device and to measure and store in the digital memory of the control unit a second digital value corresponding to the time for the capacitor to discharge to said given voltage level, and then to determine in digital form the setting of said variable impedance device by forming a quotient of one of the first and second stored digital values divided by at least one other of the stored first and second digital values.

6. An apparatus as claimed in claim 5 wherein said quotient comprises the first digital value divided by the sum of the first and second digital values or the second digital value divided by the sum of the first and second digital values.

7. An apparatus as claimed in claim 5 wherein said quotient comprises the first digital value divided by the second digital value or the second digital value divided by the first digital value.

8. An apparatus as claimed in claim 5 wherein said preset program controls the first and second controllable switches so that the first and second switches are both open in order to cause the capacitor to charge to said initial state of charge.

9. An apparatus as claimed in claim 8 wherein said preset program controls the first and second controllable switches so that the first switch is closed and the second switch is open during the time that the capacitor is discharged to said given voltage level via the first section of the variable impedance device.

10. An apparatus as claimed in claim 8 wherein said preset program controls the first and second controllable switches so that the second switch is closed and the first switch is open during the time that the capacitor is discharged to said given voltage level via the second section of the variable impedance device.

11. An apparatus as claimed in claim 5 wherein said variable impedance device comprises a resistance potentiometer, said first and second terminals of the potentiometer are connected to the one terminal of the first and second supply terminals via first and second resistors of equal resistance value, and wherein said resistance value is an order of magnitude greater than the resistance of the potentiometer, said control unit comprises a microprocessor, and said first and second controllable switches each comprises a transistor.

12. An apparatus as claimed in claim 5 wherein said first and second terminals of the variable impedance device are each coupled to the first supply terminal and said first and second controllable switches are coupled between the second supply terminal and the first and second terminals, respectively, of the digital control unit.

13. An apparatus as claimed in claim 12 wherein said point of reference voltage to which the capacitor is connected comprises the second supply terminal.

14. An apparatus as claimed in claim 5 wherein said first and second controllable switches selectively couple said first and second terminals, respectively, of the control unit to the first supply terminal, said apparatus further comprising;

third and fourth switches controllable by the control unit so as to selectively couple said first and second terminals, respectively, of the control unit to the second supply terminal, and wherein said control unit under control of its preset program closes the first and second switches during a first time period so as to charge the capacitor to said initial state of charge, and then opens said first and second switches and subsequently closes the third switch, and then after the first digital value is stored it opens the third switch.

15. An apparatus as claimed in claim 5 wherein said control unit under control of its preset program opens the first and second switches during a first time period so as to charge the capacitor to said initial state of charge, and wherein the control unit then closes one of said first and second switches to discharge the capacitor and subsequently opens said one switch after the first digital value is stored in the digital memory of the control unit.

* * * * *